United States Patent
Ritchie et al.

(10) Patent No.: US 7,138,822 B2
(45) Date of Patent: Nov. 21, 2006

(54) INTEGRATED CIRCUIT AND METHOD OF IMPROVING SIGNAL INTEGRITY

(75) Inventors: Charles Graeme Ritchie, Bristol (GB); Fesseha Tessera Seifu, London (GB)

(73) Assignee: Avago Technologies Fiber IP (Singapore) Pte. Ltd., Singapore (SG)

( * ) Notice: Subject to any disclaimer, the term of this patent is extended or adjusted under 35 U.S.C. 154(b) by 38 days.

(21) Appl. No.: 10/910,067

(22) Filed: Aug. 3, 2004

(65) Prior Publication Data
US 2005/0030063 A1    Feb. 10, 2005

(30) Foreign Application Priority Data
Aug. 5, 2003    (GB) ................................ 0318291.2

(51) Int. Cl.
*H03K 17/16*    (2006.01)
*H03K 19/0175*    (2006.01)
(52) U.S. Cl. .......................... 326/30; 326/64; 326/127
(58) Field of Classification Search ................ 326/63, 326/64, 67, 68.74, 78, 115, 127
See application file for complete search history.

(56) References Cited
U.S. PATENT DOCUMENTS

| | | | |
|---|---|---|---|
| 5,034,634 A | 7/1991 | Yamamoto | 307/465 |
| 5,428,305 A | 6/1995 | Wong et al. | 326/75 |
| 5,523,702 A | 6/1996 | Maeda | 326/26 |
| 5,534,794 A | 7/1996 | Moreland | 326/63 |
| 5,969,543 A * | 10/1999 | Erickson et al. | 326/83 |
| 6,005,414 A | 12/1999 | Reay | 326/83 |
| 6,023,175 A * | 2/2000 | Nunomiya et al. | 326/68 |

FOREIGN PATENT DOCUMENTS

DE    43 36 798 A1    6/1994

OTHER PUBLICATIONS

Sylvan, K., British Patent Application No. GB 0318291.2 dated Dec. 23, 2003 (search report).

* cited by examiner

*Primary Examiner*—Daniel Chang

(57) ABSTRACT

An integrated circuit comprising a first output stage circuit and a second output stage circuit that share common input terminals and an output terminal of the first and second output stage circuits being selectably coupled between the input terminals and the output terminal in preference to the other.

20 Claims, 3 Drawing Sheets

INTEGRATED CIRCUIT AND METHOD OF IMPROVING SIGNAL INTEGRITY

FIELD OF INVENTION

The present invention relates to an integrated circuit of the type capable of generating output signals having logic levels substantially conforming to those of a first logic family, for example Positive Emitter-Coupled Logic (PECL), Current Mode Logic (CML), or Transistor-Transistor Logic (TTL). The present invention also relates to a method of improving signal integrity, for example for signals generated by the above-mentioned integrated circuit.

DISCUSSION OF THE BACKGROUND ART

A fibre-optic transceiver module typically comprises an output stage circuit for an interface between the transceiver module and a circuit board for receiving the transceiver module. The output stage circuit is usually manufactured as part of an integrated circuit for connection to the circuit board, the integrated circuit often being capable of generating a number of output signals respectively at different output terminals or pads. The output signals generated have respective different logic levels associated therewith, each confirming to known logic families, for example, PECL, CML and/or TTL.

A disadvantage of providing different output signals at respectively different output terminals is that selection of one of the number of output signals requires a switch external to the integrated circuit to switch a desired output signal onto the circuit board, or hardwiring of an output terminal, corresponding to the desired logic family, to the circuit board. Unfortunately, the need for the external switch is accompanied by component costs, board space penalties and research and development set-up time costs. The option of hardwiring the integrated circuit is at the cost of a reducing in flexibility.

Another known solution is to design the circuit board to accommodate two similarly configured integrated circuits in a same location on the circuit board. During manufacture of the transceiver module, one of the two integrated circuits is simply selected, depending upon the output stage required. However, the topology of the output stage cannot be changed easily without remanufacture, constituting a flexibility penalty.

SUMMARY OF THE INVENTION

According to a first aspect of the present invention, there is provided a selectable logic family output stage integrated circuit comprising: a first output stage circuit coupled or coupleable to a first input and an output, and capable of generating a first output signal at the output, the first output signal having logic levels substantially conforming to those of a first logic family; characterised by: a second input; a second output stage circuit coupled or coupleable to the first input and the output, the second output stage circuit being capable of generating at the output a second output signal having logic levels substantially conforming to those of a second logic family; and a circuit selector coupled to the second input, and arranged to permit selection of the first or the second output stage circuit so as to provide one of the first or the second output signals at the output.

Selection by the circuit selector of the first or the second output stage circuit may be in response to a selection signal provided at the second input.

The first logic family may be PECL. The second logic family may be CML.

The second output stage circuit may comprise a pull-up resistor to cause the output, when operatively coupled to the second output stage circuit, to operate as a terminated voltage output.

The circuit may further comprise a polarity inversion unit coupled between the first input and, respectively, the first and the second output stage circuits, the polarity inversion unit also being coupled to a polarity control terminal of the second input. The polarity inversion unit may be an XNOR logic gate.

The output may be common to the first and the second output stage circuits. The output may be coupled to a single terminal.

The second input may comprise at least two input terminals for receiving a digital control signal.

The circuit selector may comprise a plurality of logic gates arranged so as to permit selection of the first output stage circuit in preference to the second output stage circuit, or the second output stage circuit in preference to the first output stage circuit.

The circuit selector may comprise a plurality of electronic switches to permit selection of the first output stage circuit in preference to the second output stage circuit, or the second output stage circuit in preference to the first output stage circuit. A number of the plurality of electronic switches may be Field Effect Transistors.

A number of the electronic switches may be coupled with respect to the first and second output stage circuits so as to minimise a loading effect of the first output stage circuit on the second output stage circuit and/or the second output stage circuit on the first output stage circuit.

The circuit selector may be configured to select the first output stage circuit in preference to the second output stage circuit by powering-up the first output stage circuit and powering-down the second output stage circuit, or to select the second output stage circuit in preference to the first output stage circuit by powering-up the second output stage circuit and powering-down the first output stage circuit.

The circuit may comprise at least one termination resistor shared by the first and the second output stage circuits so as to reduce parasitic loading effects.

The circuit may further comprise a programmable impedance arrangement coupled between the output and ground, an operative impedance value of the programmable impedance arrangement being selectable in order to match an expected load impedance. The programmable impedance arrangement may comprise at least two impedances coupleable to an impedance arrangement input and an impedance arrangement output.

The operative impedance value may be achieved by selectively coupling one or more of the at least two impedances to the impedance arrangement input and the impedance arrangement output in response to an impedance selection control signal.

A value of one of the at least two impedances may be a binary multiple of a value of another of the at least two impedances.

According to a second aspect of the present invention, there is provided a use of an array of selectable impedances for an integrated circuit output stage, the use being to match an output impedance of the integrated circuit with an expected load so as to improve integrity of a high-frequency part of a broadband data signal.

The expected load may be defined at least in part by at least one piece-part of a circuit board for coupling to the integrated circuit.

According to a third aspect of the present invention, there is provided a method of improving integrity of a high-frequency part of a broadband data signal, the method comprising the step of: matching an impedance of an output stage of an integrated circuit to an expected load.

The selectable logic family output stage IC therefore provides a single IC capable of generating, in use, an output signal at a single terminal or pad having logic levels conforming to one of a number of selectable logic families. Printed Circuit Boards (PCBs) do not, therefore need to be provided with external switches to select a desired logic family for the output signal. The need to design the PCB to accommodate ICs having different pin-configurations is also obviated, as is the need to select and hardwire one of a number of output pads of a known IC to the PCB. Consequently, the IC of the present invention is well suited to a number of different applications using, if required, a single PCB design. It can therefore be seen that a greater degree of design flexibility is available to a designer of transceiver modules, resulting in further benefits in terms of the need for fewer components, savings in PCB space used, component costs and research and development setup time needed.

By sharing terminating resistors, parasitic loading effects are mitigated, permitting some output stage integrated circuits to be operated at frequencies of the order of GHz. Additionally, strategic positioning of the Field Effect Transistors (FETs) in the integrated circuit avoids deterioration of the output signals caused by loading effects in either PECL or CML modes, thereby enabling high-frequency operation.

It is also thus possible, using the programmable matching capacitor, to maintain the integrity, i.e. shape, of a PECL output signal. Additionally, the matching capacitors provide, for CML output signals, Electromagnetic Interference (EMI) filtering to maintain optimum system performance for various different data rate applications.

BRIEF DESCRIPTION OF THE DRAWINGS

At least one embodiment of the invention will now be described, by way of example only, with reference to the accompanying drawings, in which.

DETAILED DESCRIPTION OF THE PREFERRED EMBODIMENT

Figure 1:
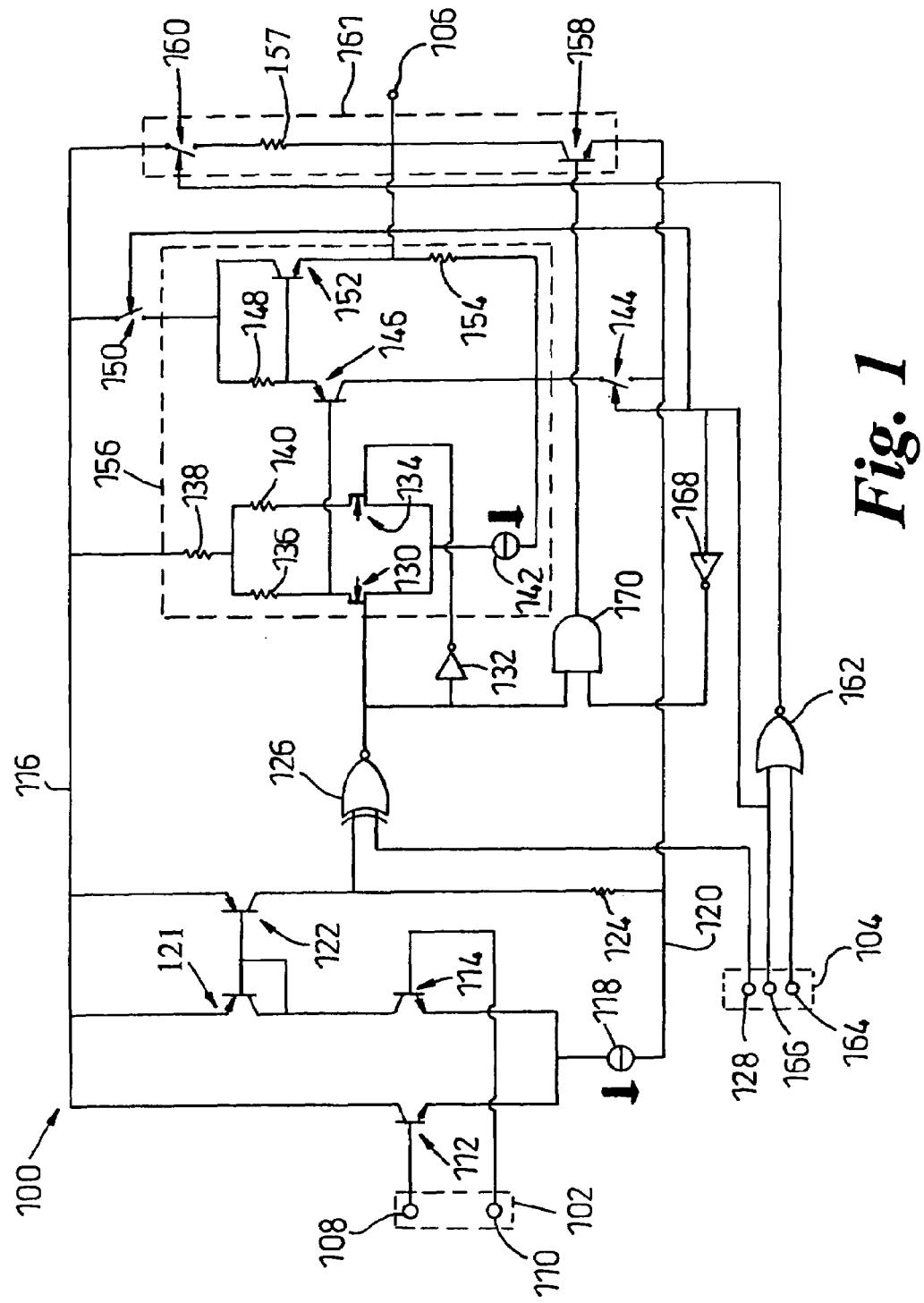
FIG. 1 is a circuit diagram for a selectable logic family output stage IC constituting a first embodiment of the invention.

Referring to FIG. 1, a selectable logic family output stage IC 100 comprises a first input 102, a second input 104 and an output 106. The first input 102 comprises a first differential input terminal 108 and a second differential input terminal 110, the first differential input terminal 108 being coupled to a base terminal of a first npn bipolar transistor 112 and the second differential input terminal 110 being coupled to a base terminal of a second npn bipolar transistor 114.

A collector terminal of the first npn transistor 112 is coupled to, in this example, a positive power rail 116 maintained at $V_{cc}$ volts by a power supply (not shown). An emitter terminal of the first npn transistor 112 and an emitter terminal of the second npn transistor 114 are coupled to a first terminal of a constant current source 118, a second terminal of the current source 118 being coupled to a ground rail 120.

A collector terminal of the second npn transistor 114 is coupled to a collector terminal of a first pnp bipolar transistor 121, an emitter terminal of the first pnp transistor 121 being coupled to the power rail 116. A base terminal of the first pnp transistor 121 is coupled to the collector terminal thereof and a base terminal of a second pnp bipolar transistor 122. An emitter terminal of the second pnp transistor 122 is also coupled to the power rail 116, and the collector terminal of the second pnp transistor 122 is coupled to a first terminal of a first resistor 124. A second terminal of the first resistor 124 is coupled to the ground rail 120.

The first and second npn transistors 112, 114 in combination with the first current source 118 constitute a first differential-pair circuit. The first differential-pair circuit is coupled to a current mirror circuit formed by the first and second pnp transistors 121, 122 and the first resistor 124. The provision of the differential-pair circuit coupled to the current mirror circuit serves to convert a differential input signal into a single-ended input signal, and to amplify the single-ended input signal to provide so-called "rail-to-rail" voltage "swings" to drive on XNOR logic gate 126. Consequently, the skilled person will appreciate that the first-differential pair circuit and the current mirror circuit are not required if the single-ended input signal can be provided at the first input 102 with a sufficiently wide voltage "swing". In such a case, the XNOR logic gate 126 can be coupled directly to the first input 102.

However, in this example, the collector terminal of the second pnp transistor 122 of the current mirror is coupled to a first input terminal of the XNOR logic gate 126. A second input terminal of the XNOR logic gate 126 is coupled to a polarity control terminal 128 of the second input 104, an output terminal of the XNOR logic gate 126 being coupled to a gate terminal of a first n-channel Metal-Oxide Semiconductor Field Effect Transistor (MOSFET) 130 and an input terminal of a first inverter 132. An output terminal of the first inverter 132 is coupled to a gate terminal of a second n-channel MOSFET 134. A drain terminal of the first MOSFET 130 is coupled to a first terminal of a second resistor 136, a second terminal of the second resistor 136 being coupled to a first terminal of a third resistor 138. Similarly, a drain terminal of the second MOSFET 134 is coupled to a first terminal of a fourth resistor 140, a second terminal of the fourth resistor 140 being coupled to the first terminal of the third resistor 138. A second terminal of the third resistor 138 is coupled to the power rail 116.

A source terminal of the first MOSFET 130 and a source terminal of the second MOSFET 134 are coupled to a first terminal of a second constant current source 142, a second terminal of the current source 142 being coupled to a first terminal of a first switching device 144, such as a drain terminal of a Field Effect Transistor (FET). Together, the first and second MOSFETs 130, 134, the second, third and fourth resistors 136, 138, 140 and the second current source 142 constitute a second differential-pair circuit.

The drain terminal of the first MOSFET 130 is also coupled to a base terminal of a third pnp bipolar transistor 146. An emitter terminal of the third pnp transistor 146 is coupled to a first terminal of a fifth resistor 148, a second terminal of the fifth resistor 148 being coupled to a first terminal of a second switching device 150, such as a source terminal of a second FET. Together, the third pnp transistor 146 and the fifth resistor 148 constitute a pnp follower circuit.

The emitter terminal of the third pnp transistor 146 is coupled to a base terminal of a third npn bipolar transistor 152, a collector terminal of the third npn transistor 152 being coupled to the first terminal of the second switching device 150 and an emitter terminal of the third npn transistor 152 being coupled to a first terminal of a sixth resistor 154.

A second terminal of the sixth resistor 154 and the collector terminal of the third pnp transistor 146 are coupled to the first terminal of the first switching device 144. The emitter terminal of the third pnp transistor 152 and the first terminal of the sixth resistor 154 are also coupled to the output terminal 106. Together, the third npn transistor 152 and the sixth resistor 154 constitute an npn emitter follower circuit, and the second differential-pair circuit, the pnp follower circuit and the npn emitter follower circuit, together, constitute a PECL output stage circuit 156.

The output terminal 106 is also coupled to a first terminal of a seventh resistor 157 and a collector terminal of a fourth npn bipolar transistor 158, a second terminal of the seventh resistor 157 being coupled to a first terminal of a third switching device 160, for example a source terminal of a third FET. A second terminal of the third switching device 160, for example a drain terminal of the third FET, is coupled to the power rail 116. Together the fourth npn transistor 158, the seventh resistor 156 and the third switching device 160 constitute a TTL output stage circuit 161. A control terminal of the third switching device 160, for example a gate terminal, is coupled to an output terminal of a NOR logic gate 162, a first input terminal of the NOR logic gate 162 being coupled to an open collector mode selection terminal 164 of the second input 104. A PECL/TTL mode selection terminal 166 of the second input 104 is coupled to a second input terminal of the NOR logic gate 162.

The PECL/TTL mode selection terminal 166 is also coupled to a control terminal, for example a gate terminal, of the first switching device 144 and a control terminal, for example a gate terminal, of the second switching device 150. A second terminal, for example a drain terminal, of the second switching device 150 is coupled to the power rail 116 and a second terminal, for example a source terminal, of the first switching device 144 is coupled to the ground rail 120.

The PECL/TTL mode selection terminal 166 is additionally coupled to a first terminal of a second inverter 168, a second terminal of the second inverter 168 being coupled to a first terminal of an AND logic gate 170. A second terminal of the AND logic gate 170 is coupled to the output terminal of the XNOR logic gate 126. An output terminal of the AND logic gate 170 is coupled to a base terminal of the fourth npn transistor 158, an emitter terminal of the fourth npn transistor 158 being coupled to the ground rail 120.

In operation, a differential input signal is applied across the first and second differential input terminals 108, 110 of the first input 102. The first differential-pair circuit formed by the first and second npn transistors 112, 114 and the first current source 118 behaves in accordance with the normal operational behaviour of a differential-pair circuit. By virtue of the location of the current mirror circuit, formed by the first and second pnp transistors 121, 122 being coupled to one of the branches of the first differential pair circuit, the differential input signal is converted to a single-ended input signal. The current mirror circuit also amplifies the single-ended input signal taken from the first differential-pair circuit so that, in effect, a 200–300 mV voltage level of the differential input signal is converted into the single-ended input signal capable of, in this example, a 3V voltage swing.

The amplified single-ended input signal is then sufficiently large to drive logic gates, and in particular, the XNOR logic gate 126. An output signal of the XNOR logic gate 126 serves as an input signal for both the PECL output stage circuit 156 and the TTL output stage circuit 161. Should the amplified single-ended input signal need to be inverted, the application of a LOGIC HIGH at the polarity control terminal 128 causes the output signal of the XNOR logic gate 126 to be the inverse of the amplified single-ended input signal.

At any appropriate time an output of the IC 100 can be selected to be in accordance with either the PECL logic family or the TTL logic family. In order to select that the logic levels of the output signal of the IC 100 conform to the PECL logic family a LOGIC HIGH selection signal is applied to the PECL/TTL mode selection terminal 166, resulting in the LOGIC HIGH selection signal being applied at the control terminals of the first and second switching devices 144, 150, causing the first and second switching devices 144, 150 to "close", thereby powering-up the PECL output stage circuit 156, i.e. completing coupling of the PECL output stage circuit to the power rail 116 and the ground rail 120. The LOGIC HIGH selection signal is also applied to the second inverter 168 and the NOR logic gate 162, resulting in a LOGIC LOW signal being applied to the control terminal of the third switching device 160 in order to keep the TTL output stage circuit 161 powered-down, and the second inverter 168 generating a LOGIC LOW signal. In response to the LOGIC LOW signal, the AND logic gate 170 generates a LOGIC LOW output signal irrespective of the output signal of the XNOR logic gate 126 and so the output signal of the XNOR gate 126, corresponding to the differential input signal, is not applied to the TTL output stage circuit 161.

As a result of the PECL output stage circuit being activated, or enabled, the second differential-pair circuit is capable of responding to the output signal of the XNOR gate 126, the output signal of the XNOR gate 126 being converted back to a differential input signal by virtue of the coupling of the first inverter 132 to the output terminal of the XNOR gate 126. In response to the differential input signal applied between the gate terminals of the first and second MOSFETs 130, 134, the second differential-pair circuit operates in accordance with the normal behaviour expected of such differential-pair circuits, a voltage drop across the third resistor 138 occurring in order to provide a shift in the Direct Current (DC) voltage level of an output signal taken from the drain terminal of the first MOSFET 130.

The output signal taken from the drain terminal of the first MOSFET 130 is applied to the base terminal of the third pnp transistor 146 of the pnp follower circuit, the pnp follower circuit performing a buffering function as well as shifting the DC level of the output signal taken from the drain terminal of the first MOSFET 130 (constituting an output signal of the pnp follower circuit). Thereafter, the output signal of the pnp follower circuit is applied to the base terminal of the third npn transistor 152 of the emitter follower circuit, an output of the emitter follower circuit being provided at the output terminal 106, constituting the output signal of the IC 100 when the PECL output stage circuit 156 is being selected in preference to the TTL output stage circuit 161.

When the logic levels of the output signal of the IC 100 are required to conform with those of the TTL logic family, a LOGIC LOW selection signal is applied to the PECL/TTL mode selection terminal 166. In response to the LOGIC LOW selection signal, the control terminals of the first and second switching devices 144, 150 are held at LOGIC LOW, resulting in the first and second switching devices 144, 150 being "open", depriving the PECL output stage circuit 156 of power, i.e. powering-down the PECL output stage circuit 156. Additionally, the LOGIC LOW selection signal is translated into a LOGIC HIGH signal by the second inverter 168, resulting in the LOGIC HIGH signal being applied at the second input terminal of the AND logic gate 170. The TTL output stage circuit 161 therefore becomes enabled and by applying a LOGIC LOW signal to the open collector mode selection terminal 164, the NOR logic gate 162 generates a LOGIC HIGH signal irrespective of the signal applied to the PECL/TTL mode selection terminal 166, resulting in the third switching device 160 assuming a "closed" state so as to couple the seventh resistor 157 in-circuit with respect to the TTL output stage circuit 161. In this state, the TTL output stage circuit 161 operates in a voltage-driving mode.

Consequently, the output signal of the XNOR gate 126, corresponding to the differential input signal applied between the first and second differential input terminals 108, 110, is therefore applied to the base terminal of the fourth npn transistor 158 of the TTL output stage circuit 161 via the AND logic gate 170. The fourth npn transistor 158 responds accordingly to the application of the output signal of the XNOR gate 126 to the base of the fourth npn transistor 158 and, when appropriate, enters into a conductive state so as to cause current to flow through the seventh resistor 157. A voltage drop therefore selectively occurs across the seventh resistor 157 resulting in the logic level of the output signal of the IC 100 at the output terminal 106 conforming to the logic levels of the TTL logic family.

If the output signal of the IC 100 needs to conform to a signal constituting a TTL logic family signal, but in an open collector mode, a LOGIC HIGH selection signal is applied at the open collector mode selection terminal 164. The application of the LOGIC HIGH selection signal at the open collector mode selection terminal 164 results in the NOR logic gate 162 applying a LOGIC LOW signal at the control terminal of the third switching device 160. The third switching device 160 consequently assumes an "open" state. Consequently, when the fourth npn transistor 158 conducts in response to the output signal of the AND logic gate 170, the fourth npn transistor "sinks" current from a load (not shown) attached to the output terminal 106 of the IC 100 to ground, because the seventh resistor 157 is decoupled from the TTL output stage circuit 161.

In another embodiment of the invention (FIG. 2), a high-speed IC 200 comprises a first input 202 comprising a first differential input terminal 204, a second differential input terminal 206, and a bias control terminal 208. The high-speed IC 200 also comprises a second input 210 comprising a PECL/CML mode select terminal 212, and an output 214 comprising a first differential output terminal 216 and a second differential output terminal 218.

The first and second differential input terminals 204, 206 are respectively coupled to a base terminal of a first npn bipolar transistor 220 and a base terminal of a second npn bipolar transistor 222 of a PECL output stage circuit 224, as well as a base terminal of a third npn bipolar transistor 226 and a base terminal of a fourth npn bipolar transistor 228 of a CML output stage circuit 258, respectively.

An emitter terminal of the first npn transistor 220 is coupled to a collector terminal of a fifth npn transistor 230, a base terminal of the fifth npn transistor 230 being coupled to the bias control terminal 208 and an emitter terminal of the fifth npn transistor 230 being coupled to a first terminal of a first resistor 232. An emitter terminal of the second npn transistor 222 is coupled to a collector terminal of a sixth npn bipolar transistor 234, a base terminal of the sixth npn bipolar transistor 234 being coupled to the bias control terminal 208 and an emitter terminal of the sixth npn transistor 234 being coupled to a first terminal of a second resistor 236. A second terminal of the first resistor 232 and a second terminal of the second resistor 236 are coupled to a drain terminal of a first, n-channel MOSFET 238. The drain terminal of the first MOSFET 238 is also coupled to a first terminal of a third resistor 240 having a second terminal coupled to an emitter terminal of a seventh npn bipolar transistor 242. A base terminal and a collector terminal of the seventh npn transistor 242 are respectively coupled to the bias control terminal 208 and emitter terminals of an eighth npn bipolar transistor 244 and a ninth npn bipolar transistor 246.

A base terminal of the eighth npn transistor 244 is coupled to the emitter terminal of the second npn transistor 222 and a base terminal of the ninth npn transistor 246 is coupled to the emitter terminal of the first npn transistor 220. Collector terminals of the eighth and ninth npn transistors 244, 246 are respectively coupled to first terminals of a fourth resistor 248 and a fifth resistor 250, second terminals of the fourth and fifth resistors 248, 250 being coupled to a source terminal of a second, p-channel, MOSFET 252. The source terminal of the second MOSFET 252 is also coupled to collector terminals of the first and second bipolar transistors 220, 222, as well as collector terminals of a tenth npn bipolar transistor 254 and an eleventh npn bipolar transistor 256. A base terminal of the tenth npn transistor 254 is coupled to the collector terminal of the eighth npn transistor 244 and a base terminal of the eleventh npn transistor 256 is coupled to the collector terminal of the ninth npn transistor 246. Emitter terminals of the tenth and eleventh npn transistors 254, 256 are respectively coupled to the second differential output terminal 218 and the first differential output terminal 216. Together, the first, second, fifth, sixth, seventh, eighth, ninth, tenth and eleventh npn transistors, 220, 222, 230, 234, 242, 244, 246, 254, 256 and the first, second third, fourth and fifth resistors 232, 236, 240, 248, 250 constitute the PECL output stage circuit 224.

In addition to the third and fourth npn transistor 226, 228 the CML output stage circuit 258 is structured as follows. A collector terminal of the third transistor 226 and a collector terminal of the fourth npn transistor 228 are coupled to a supply voltage rail 260, an emitter terminal of the third transistor 226 being coupled to a drain terminal of a third, n-channel, MOSFET 262 and an emitter terminal of the fourth transistor 228 being coupled to a drain terminal of a fourth, n-channel, MOSFET 264. A source terminal of the third MOSFET 262 is coupled to a collector terminal of a twelfth npn transistor 266 and a source terminal of the fourth MOSFET 264 is coupled to a collector terminal of a thirteenth npn transistor 268. A base terminal of the twelfth transistor 266 and a base terminal of the thirteenth transistor 268 are both coupled to the bias control terminal 208. An emitter terminal of the twelfth transistor 266 is coupled to a first terminal of a sixth resistor 270, and an emitter terminal of the thirteenth transistor 268 is coupled to a first terminal of a seventh resistor 272. The second terminals of the sixth and seventh resistors 270, 272 are coupled to a drain terminal of a fifth, n-channel, MOSFET 274 and a first terminal of an eighth resistor 276, a second terminal of the eighth resistor 276 being coupled to an emitter terminal of a fourteenth npn transistor 278. A base terminal of the fourteenth npn transistor 278 is coupled to the bias control terminal 208 and a collector terminal of the fourteenth transistor 278 is coupled to emitter terminals of a fifteenth npn transistor 280 and a sixteenth npn transistor 282. The base terminal of the fifteenth npn transistor 280 is coupled to the source terminal of the fourth MOSFET 264, a gate terminal of the fourth MOSFET 264 being coupled to a gate terminal of the third MOSFET 262. The gate terminals of the third and fourth MOSFETs 262, 264 are also coupled to the PECL/CML mode select terminal 212 and a gate terminal of the fifth MOSFET 274. The base terminal of the sixteenth transistor 282 is coupled to the source terminal of the third MOSFET 262. A collector terminal of the fifteenth transistor 280 is coupled to the second differential output terminal 218 and a first terminal of a ninth resistor 284. A collector terminal of the sixteenth transistor 282 is coupled to the first differential output terminal 216 and a first terminal of a tenth resistor 286. Second terminals of the ninth and tenth resistors 284, 286 are coupled, respectively, to a source terminal of a sixth, p-channel, MOSFET 288 and a source terminal of a seventh, p-channel, MOSFET 290. The second terminal of the ninth resistor 284 is also coupled to a first terminal of an eleventh resistor 292, a second terminal of the eleventh resistor 292 being coupled to a drain terminal of an eighth, n-channel, MOSFET 294. The second terminal of the tenth resistor 286 is also coupled to a first terminal of a twelfth resistor 296, a second terminal of the twelfth resistor 296 being coupled to a drain terminal of a ninth, n-channel, MOSFET 298. Gate terminals of the eighth and ninth MOSFETs 294, 298 are coupled to an output terminal of an inverter 300, an input terminal of the inverter 300 and a gate terminal of the second MOSFET 252 being coupled to the PECL/CML mode select terminal 212. Gate terminals of the first, sixth and seventh MOSFETs, 238, 288, 290 are also coupled to the output terminal of the inverter 300. The drain terminals of the sixth and seventh MOSFETs 288, 290 are coupled to the voltage supply rail 260 as is the drain terminal of the second MOSFET 252. Source terminals of the first, fifth, eighth and ninth MOSFETs 238, 274, 294, 298 are coupled to a ground rail 302.

In operation, activation of the PECL output stage circuit 224 or the CML output stage circuit 258 is selected by applying a logic HIGH or a logic LOW signal to the PECL/CML mode select terminal 212. In order to set a current flowing through the output stage circuits 224, 258, a bias voltage is applied to the bias control terminal 208.

When the logic LOW signal is applied to the PECL/CML mode selection terminal 212, the first, second, eighth and ninth MOSFETs 238, 252, 294, 298 exhibit a low impedance between their respective drain and source terminals, and the third, fourth, fifth, sixth and seventh MOSFETs, 262, 264, 274, 288, 290 exhibit a high impedance between their respective drain and source terminals. Consequently, the PECL output stage circuit 224 is provided with current and so assumes a powered-up state, and the CML output stage circuit 258 is deprived of current and so assumes a powered-down state.

When powered-up, a differential input signal applied across the first and second differential input terminals 204, 206 is applied to the base terminals of the first and second npn transistors 220, 222 of the PECL output stage circuit 224 for processing by the PECL output stage circuit 224. Whilst the differential input signal is also applied to the base terminals of third and fourth npn transistors 226, 228 of the CML output stage circuit 258, the differential input signal is not processed by the CML output stage circuit 258, because the CML output stage circuit 258 is powered-down.

When the PECL output stage circuit 224 is powered-up, the third and fourth npn transistors 226, 228 can still be activated by the differential input signal applied to the first and second differential input terminals 204, 206. Consequently, the third and fourth MOSFETs 262, 264 serve to isolate the emitter terminals of the third and fourth npn transistors 226, 228 from the base terminals of the fifteenth and sixteenth npn transistors 280, 282, because the collector terminals of the fifteenth and sixteenth npn transistors 280, 282 are coupled to the first and second differential output terminals 216, 218 and so follow the voltage levels provided at the first and second differential output terminals 216, 218 by the PECL output stage circuit 224. If not prevented from switching whilst the PECL output stage circuit 224 is powered-up, the fifteenth and sixteenth npn transistors 280, 282 will constitute a parasitic load and cause the quality of the PECL differential output signal to degrade in such a way that the PECL differential output signal possesses so-called pattern-dependent jitter. This is particularly important when the PECL differential output signal is a high speed signal, for example in the order of Gbps. Consequently, the fifteenth and sixteenth npn transistors 280, 282 are decoupled from the third and fourth npn transistors 226, 228 by the high impedance of the third and fourth MOSFETs 262, 264 in this mode of operation.

The first and second npn transistors 220, 222 in combination with the first and second resistors 232, 236 constitute a first pair of emitter follower circuits, the first pair of emitter follower circuits serve to shift the voltage level of the differential input signal, and acts as a buffer between the first and second differential input terminals 204, 206 and a first differential pair circuit. The first differential pair circuit comprises the eighth and ninth npn transistors 244, 246 and the third, fourth and fifth resistors 240, 248, 250. Signals generated at the emitter terminals of the first and second npn transistors 220, 222 of the first pair of emitter follower circuits drive the base terminals of the eighth and ninth npn transistors 244, 246, respectively, of the first differential pair circuit. The first differential pair circuit amplifies the signals generated at the outputs of the first pair of emitter follower circuits, signals generated at the collector terminals of the eighth and ninth npn transistors 244, 246 driving the base terminals of the tenth and eleventh npn transistors 254, 256, respectively, the tenth and eleventh npn transistors 254, 256 constituting a second pair of emitter follower circuits. The provision of the second pair of emitter follower circuits coupled after the first differential pair circuit is a standard feature of PECL output driver circuits. By virtue of the emitter terminals of the tenth and eleventh npn transistors 254, 256 being coupled to the second and first differential output terminals 218, 216, respectively, the differential input signal is provided as a PECL differential output signal at the first and second output terminals 216, 218.

The activation of the eighth and ninth MOSFETs 294, 298 causes the eleventh and twelfth resistors 292, 296 to be switched in-circuit, resulting in the first and second differential output terminals being terminated to ground through the ninth and eleventh resistor pair 284, 292 and the tenth and twelfth resistor pair 286, 296 when the PECL output stage circuit 224 is powered-up. The ninth and twelfth resistors 284, 296 and the tenth and eleventh resistors 286, 292 constitute a load to bias the PECL output stage circuit 224 to a suitable current. If necessary, the values of the eleventh and twelfth resistors 292, 296 can be increased to reduce the total termination current to less than 30 mA, thereby providing a performance advantage of lower power consumption and hence less heat dissipation. A lower cost fan can then be employed in a housing in which the transceiver module is disposed.

If the logic HIGH signal is applied to the PECL/CML mode selection terminal 212, the first, second, eighth and ninth MOSFETs 238, 252, 294, 298 exhibit a high impedance across their respective drain and source terminals, and the third, fourth, fifth, sixth and seventh MOSFETs 262, 264, 274, 288, 290 exhibit a low impedance across their respective drain and source terminals. Consequently, the PECL output stage circuit 224 is deprived of current and so assumes a powered-down state, and the CML output stage circuit 258 is provided with current and so assumes a powered-up state.

The voltage level of the differential input signal applied to the base terminals of the third and fourth npn transistors 226, 228, by virtue of the base terminals of the third and fourth npn transistors 226, 288 being respectively coupled to the first and second differential input terminals 204, 206 is shifted by a third pair of emitter follower circuits formed by the third and fourth npn transistors 226, 228 and the sixth and seventh resistors 270, 272. Respective outputs of the third pair of emitter follower circuits taken from the emitter terminals of the third and fourth transistors 226, 228 drive the base terminals of the sixteenth and fifteenth npn transistors 282, 280, the fifteenth and sixteenth npn transistors 280, 282 and the eighth, ninth and tenth resistors 276, 284, 286 functioning in combination to constitute a second differential pair circuit. The second differential pair circuit serves to amplify the respective outputs taken from the third emitter follower circuit, outputs taken from the second differential pair circuit being provided at the first and second output terminals 216, 218 as a CML differential output signal.

The de-activation of the eighth and ninth MOSFETs 294, 298 causes the eleventh and twelfth resistors 292, 296 to be decoupled from the first and second differential output terminals 216, 218 and so the first and second differential output terminals 216, 218 are terminated to the supply rail 260 when the CML output stage circuit 258 is powered-up.

Figure 2:
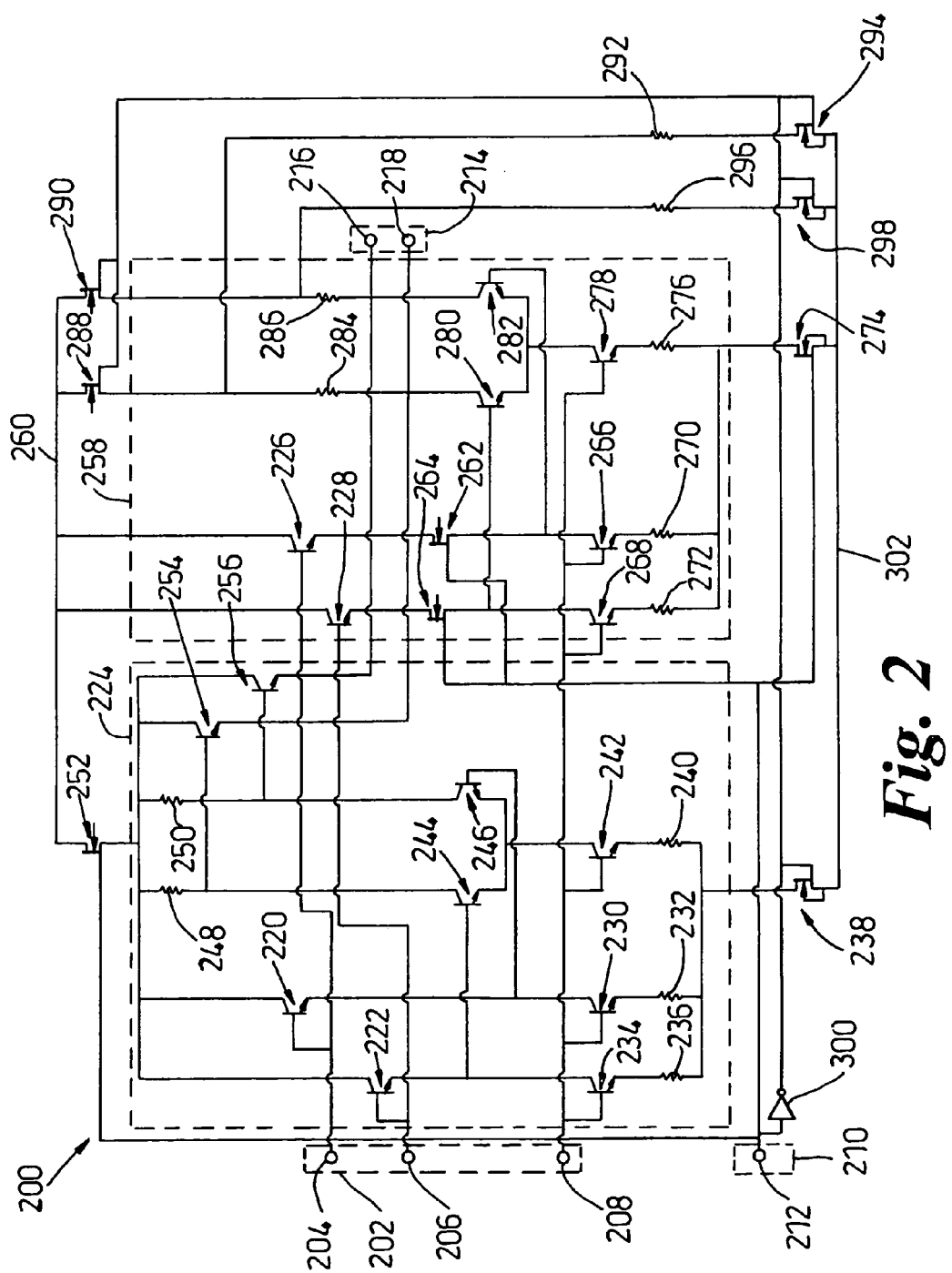
FIG. 2 is a circuit diagram for another selectable logic family output stage IC constituting a second embodiment of the invention.
Figure 3:
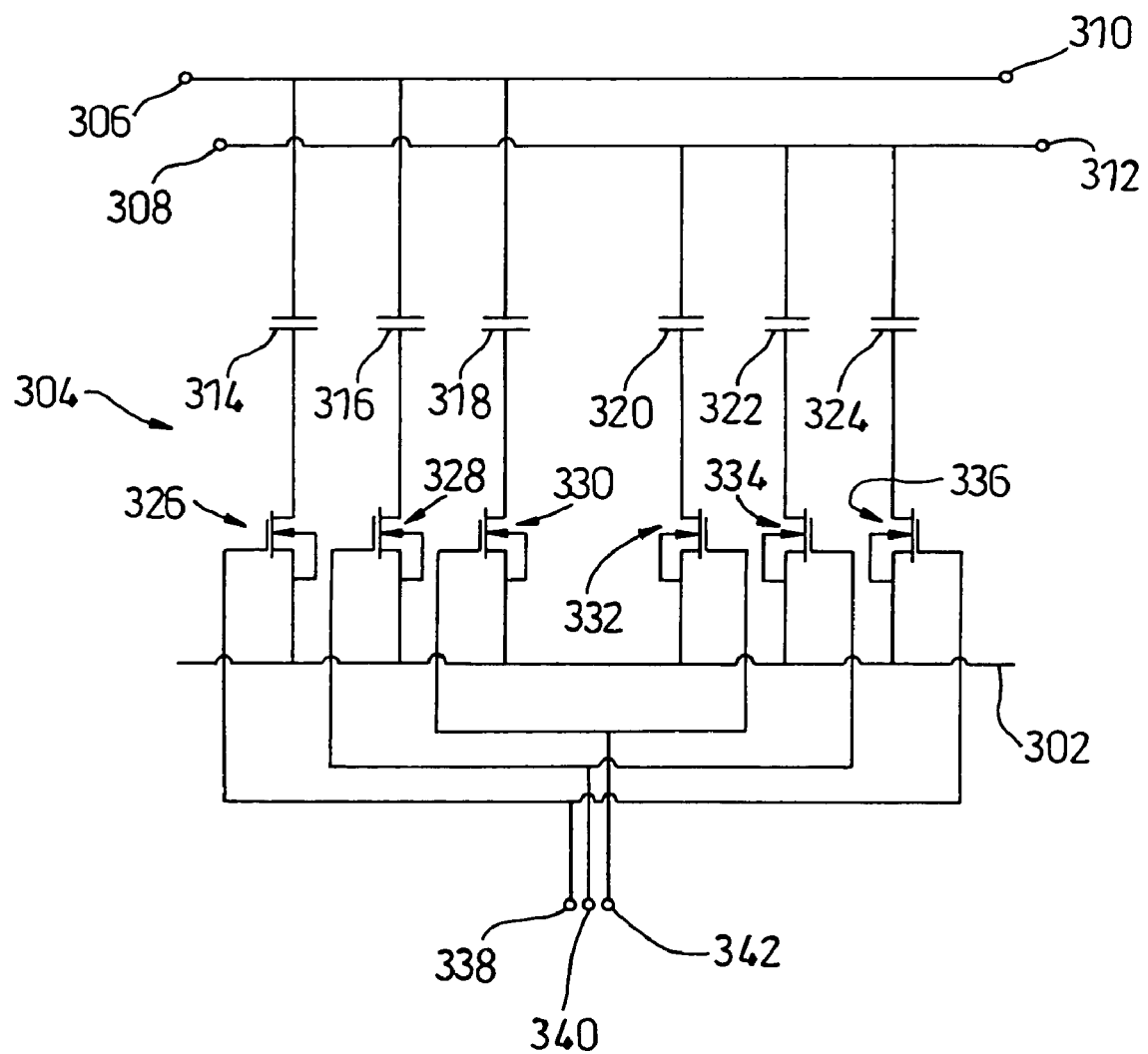
FIG. 3 is a circuit diagram of an impedance matching circuit.

Although not shown in FIG. 2, a programmable array of matching capacitors 304 (FIG. 3) can be coupled between the first and second differential output terminals 216, 218 and the ground rail 302. More precisely, a first array input terminal 306, of the array 304 is coupled to the first differential output terminal 216 and a second array input terminal 308 is coupled to the second differential output terminal 218, the first array input terminal 306 being coupled to a first array output 310 terminal constituting a new first differential output terminal and the second array input terminal 308 being coupled to a second array output terminal 312 constituting a new second differential output terminal.

The first array input terminal 306 is coupled to respective first terminals of a first capacitor 314, a second capacitor 316 and a third capacitor 318. Similarly, the second array input terminal 308 is coupled to respective first terminals of a fourth capacitor 320, a fifth capacitor 322 and a sixth capacitor 324. Each second terminal of the first, second, third, fourth, fifth and sixth capacitors 314, 316, 318, 320, 322, 324 is respectively coupled to a drain terminal of a first, n-channel, MOSFET 326, a second, n-channel, MOSFET 328, a third, n-channel, MOSFET 330, a fourth, n-channel, MOSFET 332, a fifth, n-channel, MOSFET 334 and a sixth, n-channel, MOSFET 336. A source terminal of the first, second, third, fourth, fifth and sixth MOSFETs 326, 328, 330, 332, 334, 336 are each coupled to the ground rail 302.

A gate terminal of each of the first and sixth MOSFETs 326, 336 is coupled to a first array control terminal 338. A gate terminal of each of the second and fifth MOSFETs 316, 322 is coupled to a second array control terminal 340, and a gate terminal of each of the third and fourth MOSFETs 330, 332 is coupled to a third array control terminal 342.

In operation, application of a logic HIGH signal at the first array control terminal 338 results in the first and sixth capacitors 314, 324 being switched in-circuit so that the first capacitor 314 is effectively coupled between the first differential output terminal 216 and the ground rail 302, and the sixth capacitor 324 is effectively coupled between the second differential output terminal 218 and the ground rail 302. Application of a logic HIGH signal at the second array control terminal 340 results in the second and fifth capacitors 316, 322 being switched in-circuit so that the second capacitor 316 is effectively coupled between the first differential output terminal 216 and the ground rail 302, and the fifth capacitor 322 is effectively coupled between the second differential output terminal 218 and the ground rail 302. Similarly, application of a logic HIGH signal at the third array control terminal 342 results in the third and fourth capacitors 318, 320 being switched in-circuit so that the third capacitor 318 is effectively coupled between the first differential output terminal 216 and the ground rail 302, and the fourth capacitor 320 is effectively coupled between the second differential output terminal 218 and the ground rail 302. By applying a logic HIGH signal at any one of the first, second or third array control terminals 338, 340, 342, a pair of capacitors is switched in-circuit, resulting in a respective capacitor being coupled between the first differential output terminal 216 and the ground rail 302 and the second differential output terminal 218 and the ground rail 302. The values of the first, second, third, fourth, fifth and sixth capacitors 314, 316, 318, 320, 322, 324 can be any suitable values necessary for the application of the high-speed IC 200. Also, the capacitance applied across the first and second differential output terminals 216, 218 and the ground rail 302 can be varied further by switching-in more than one capacitor, or one pair of capacitors, between the first and second differential output terminals 216, 218 and the ground rail 302. Hence, the exact capacitance applied between each of the first and second differential output terminals 216, 218 and the ground rail 302 can be selected by applying a digital control signal to the first, second and third array control terminals 338, 340, 342. The digital control signal can be applied, if required, using software.

When the high-speed IC 200 is installed, for example, in a circuit board (not shown), an impedance mismatch can exist between the PECL output stage circuit 224 and other components and parts external to the PECL output stage circuit 224 caused by, for example, bond wires, IC package impedance, circuit board tracks, connectors and/or other circuit boards resulting in reflections of the PECL output signal degrading the quality of the PECL output signal. By setting the digital control signal applied to the first, second and third array control terminals 338, 340, 342 to a suitable value, the capacitance applied between the first differential output terminal 216 and the ground rail 302, and the second differential output terminal 218 and the ground rail 302 can be correspondingly set to an impedance value that matches the impedance of components and/or parts external to the PECL output stage circuit 224, thereby obviating, or at least mitigating the above described reflections. In this example, it should be understood that the above impedance matching technique is being applied to improve the high frequency content of a wideband signal.

An additional use for the array 304 is to provide Electromagnetic Interference (EMI) filtering for the CML output signal for different data rates of the CML output signal.

What is claimed is:

1. A selectable logic family output stage integrated circuit comprising:
    a first output stage circuit coupled or coupleable to a first input and an output, and capable of generating a first output signal at the output, the first output signal having logic levels substantially conforming to those of a first logic family;
    a second input;
    a second output stage circuit coupled or coupleable to the first input and the output, the second output stage circuit being capable of generating at the output a second output signal having logic levels substantially conforming to those of a second logic family;
    a circuit selector coupled to the second input, and arranged to permit selection of the first or the second output stage circuit so as to provide one of the first or the second output signals at the output; and
    a programmable impedance arrangement coupled between the output and ground, an operative impedance value of the programmable impedance arrangement being selectable in order to match an expected load impedance.

2. A circuit as claimed in claim 1, wherein selection by the circuit selector of the first or the second output stage circuit is in response to a selection signal provided at the second input.

3. A circuit as claimed in claim 1, wherein the first logic family is PECL.

4. A circuit as claimed in claim 3, wherein the second logic family is CML.

5. A circuit as claimed in claim 3, wherein the second logic family is TTL.

6. A circuit as claimed in claim 5, wherein the second output stage circuit comprises a pull-up resistor to cause the output, when operatively coupled to the second output stage circuit, to operate as a terminated voltage output.

7. A circuit as claimed in claim 1, further comprising a polarity inversion unit coupled between the first input and, respectively, the first and the second output stage circuits, the polarity inversion unit also being coupled to a polarity control terminal of the second input.

8. A circuit as claimed in claim 7, wherein the polarity inversion unit is an XNOR logic gate.

9. A circuit as claimed in claim 1, wherein the output is common to the first and the second output stage circuits.

10. A circuit as claimed in claim 9, wherein the output is coupled to a single terminal.

11. A circuit as claimed in claim 1, wherein the second input comprises at least two input terminals for receiving a digital control signal.

12. A circuit as claimed in claim 1, wherein the circuit selector comprises a plurality of logic gates arranged so as to permit selection of the first output stage circuit in preference to the second output stage circuit, or the second output stage circuit in preference to the first output stage circuit.

13. A circuit as claimed in claim 1, wherein the circuit selector comprises a plurality of electronic switches to permit selection of the first output stage circuit in preference to the second output stage circuit, or the second output stage circuit in preference to the first output stage circuit.

14. A circuit as claimed in claim 13, wherein a number of the plurality of electronic switches are Field Effect Transistors.

15. A circuit as claimed in claim 13, wherein a number of the electronic switches are coupled with respect to the first and second output stage circuits so as to minimise a loading effect of the first output stage circuit on the second output stage circuit and/or the second output stage circuit on the first output stage circuit.

16. A circuit as claimed in claim 1, wherein the circuit selector is configured to select the first output stage circuit in preference to the second output stage circuit by powering-up the first output stage circuit and powering-down the second output stage circuit, or to select the second output stage circuit in preference to the first output stage circuit by powering-up the second output stage circuit and powering-down the first output stage circuit.

17. A circuit as claimed in claim 1, further comprising at least one termination resistor shared by the first and the second output stage circuits so as to reduce parasitic loading effects.

18. A circuit as claimed in claim 1, wherein the programmable impedance arrangement comprises at least two impedances coupleable to an impedance arrangement input and an impedance arrangement output.

19. A circuit as claimed in claim 18, wherein the operative impedance value is achieved by selectively coupling one or more of the at least two impedances to the impedance arrangement input and the impedance arrangement output in response to an impedance selection control signal.

20. A circuit as claimed in claim 18, wherein a value of one of the at least two impedances is a binary multiple of a value of another of the at least two impedances.

* * * * *